US006310959B1

(12) United States Patent
Alexander

(10) Patent No.: US 6,310,959 B1
(45) Date of Patent: Oct. 30, 2001

(54) TUNED ORDER CROSSOVER NETWORK FOR ELECTRO-ACOUSTIC LOUDSPEAKERS

(75) Inventor: Eric Alexander, South Ogden, UT (US)

(73) Assignee: Diaural, LLC, Ogden, UT (US)

( * ) Notice: Subject to any disclaimer, the term of this patent is extended or adjusted under 35 U.S.C. 154(b) by 0 days.

(21) Appl. No.: 09/382,017

(22) Filed: Aug. 24, 1999

(51) Int. Cl.[7] .......................... H03G 5/00
(52) U.S. Cl. .......................... 381/99; 381/100; 333/132
(58) Field of Search .......................... 381/98, 99, 100, 381/103, 107; 333/132, 170, 172, 176, 181, 171, 133

(56) References Cited

U.S. PATENT DOCUMENTS

| | | | |
|---|---|---|---|
| 3,155,774 | 11/1964 | Howell | 179/1 |
| 3,814,857 | 6/1974 | Thomasen | 179/1 D |
| 3,931,469 | 1/1976 | Elliott et al. | 179/1 D |
| 4,031,318 | 6/1977 | Pitre | 179/1 D |
| 4,037,051 | 7/1977 | Fuselier | 179/1 E |
| 4,229,619 | 10/1980 | Takahashi et al. | 179/1 D |
| 4,237,340 | 12/1980 | Klipsch | 179/1 D |
| 4,475,233 | 10/1984 | Watkins | 381/99 |
| 4,504,704 | 3/1985 | Ohyaba et al. | 179/115.5 |
| 4,597,100 | 6/1986 | Grodinsky et al. | 381/99 |
| 4,638,505 | 1/1987 | Polk et al. | 381/24 |
| 4,653,103 | 3/1987 | Mori et al. | 381/99 |
| 4,771,466 | 9/1988 | Modafferi | 381/99 |
| 4,887,609 | 12/1989 | Cole, Jr. . | |
| 4,897,879 | 1/1990 | Geluk | 381/99 |
| 4,991,221 | 2/1991 | Rush | 381/120 |
| 5,153,915 | 10/1992 | Farella | 381/205 |
| 5,302,917 | 4/1994 | Concorso | 330/264 |
| 5,568,560 | 10/1996 | Combest | 381/99 |
| 5,615,272 | 3/1997 | Kukurudza | 381/117 |

FOREIGN PATENT DOCUMENTS

| | | | |
|---|---|---|---|
| 53-64018 * | 8/1978 | (JP) | 381/99 |
| 54-13321 * | 1/1979 | (JP) | 381/99 |

OTHER PUBLICATIONS

Terman, *Radio Engineers' Handbook*, McGraw–Hill Book Company, Inc., Circuit Theory, paragraph 31. Dividng Networks, pp. 249–251, 1943.

* cited by examiner

*Primary Examiner*—Xu Mei
(74) *Attorney, Agent, or Firm*—Workman, Nydegger & Seeley

(57) ABSTRACT

A crossover network for partitioning by frequency and electrical audio signal from an amplifier into a plurality of frequency bands for presentation to respective drivers or transducers. Such a crossover network couples the respective transducers in a parallel fashion thereby locking the in-phase relationships of signals presented to the respective transducers. The present facilitates a smooth transition between high and low frequencies without creating an abrupt crossover region wherein the phase relationships interject distortion.

18 Claims, 4 Drawing Sheets

TUNED ORDER CROSSOVER NETWORK FOR ELECTRO-ACOUSTIC LOUDSPEAKERS

BACKGROUND OF THE INVENTION

1. The Field of the Invention

This invention relates generally to electro-acoustic or audio loudspeaker systems. More particularly, the invention relates to a partitioning by frequency of the electrical audio signal from the output of an audio amplifier, into a plurality of frequency bands for presentation to the electro-acoustic transducers within a loudspeaker system.

2. Present State of the Art

Audio systems present as an audible signal, simultaneous divergent audio frequencies for example music or speech for appreciation by a user. The divergent frequency content of audio may generally be considered to consist of differing frequencies. While an audio system may reinforce or reproduce the electrical audio frequency spectrum in a single pair of wires or input to a speaker, specific physical implementations of speaker components are optimized for responding to a compatible band of frequencies. For example, low frequencies tend to be better replicated by physically larger drivers commonly known as woofers. Mid-range frequencies, likewise, are more favorably reproduced by a mid-range sized driver. Additionally, higher frequencies are better reproduced by physically smaller drivers commonly known as tweeters.

While an amplifier may electrically deliver the entire audio frequency spectrum to a speaker over a single pair of wires, it is impractical to expect that the high, middle and low frequencies autonomously seek out the corresponding tweeter drivers. mid-range drivers and woofer drivers within a speaker. In fact, connecting high-power, low-frequency signals to a tweeter driver, will cause audible distortion and will typically cause fatigue and destruction of the tweeter driver.

Therefore, modern higher-fidelity audio system speakers incorporate a crossover that divides the electrical audio frequency spectrum received in a single pair of wires into distinct frequency bands or ranges and ensures that only the proper frequencies are routed to the appropriate driver. That is to say, a crossover is an electric circuit or network that splits the audio frequencies into different bands for application to individual drivers. Therefore, a crossover is a key element in multiple-driver speaker system design.

Crossovers may be individually designed for a specific or custom system, or may be commercially purchased as commercial-off-the-shelf crossover networks for both two and three-way speaker systems. In a two-way speaker system, high frequencies are partitioned and routed to the tweeter driver with low frequencies being routed to the woofer driver. A two-way crossover, which uses inductors and capacitors, accomplishes this partitioning when implemented as an electrical filter. Crossover networks have heretofore incorporated at least one or more capacitors, and usually one or more inductors, and may also include one or more resistors, which are configured together to form an electrical filter for partitioning the particular audio frequencies into bands for presentation to the appropriate and compatible driver.

FIG. 1 depicts a typical two-way crossover network within a speaker system. The crossover network of FIG. 1 may be further defined as a first-order crossover network since the resultant response of each branch of the network attenuates the signal at 6 dB per octave. The graph of FIG. 1 depicts the responses of a woofer driver and a tweeter driver resulting in a first-order crossover in a two-way speaker system. An amplifier provides signal into input pair 10 comprised or a positive input 12 and a negative input 14. In the upper branch 16 of crossover network 8, the high frequencies are filtered and allowed to pass to high frequency driver 18. Filtering is performed by capacitor 20 which inhibits the passing of lower frequencies and allows the passing of higher frequencies to high frequency driver 18. Such a portion of the crossover network is commonly referred to as a “high pass” filter.

Lower frequencies are filtered through branch 22 of crossover network 8 to low frequency driver 24 through the user of the filtering element shown as inductor 26. This portion of the crossover network is commonly referred to as a “low pass” filter. It should be pointed out that crossover networks typically implement the partitioning of the frequencies into bands through the use of network branches which are parallelly configured across positive input 12 and negative input 14 of input pair 10.

The graph of FIG. 1 illustrates the frequency responses of a woofer and tweeter driver resulting from the two-way crossover network 8. Crossover network 8 is depicted as a first order crossover in a two-way speaker system. The low frequency or woofer response 28 begins rolling off at approximately 200 Hertz. As depicted in FIG. 1, at 825 Hertz, the woofer response 28 is attenuated to a negative 3 dB from the reference response of 0 dB. Tweeter response 30 is increasing in magnitude at a rate of 6 dB per octave and at 825 hertz is also a negative 3 dB from the reference response of 0 dB. However, after 825 Hertz, tweeter response 30 increases to 0 dB while woofer response 28 continues to roll off at a rate of 6 dB per octave. The intersection of the curves depicting the woofer and tweeter response defines the “crossover frequency.” Frequencies above the crossover frequency presented at input pair 10 increasingly follow the lower impedance path of branch 16 terminating at the high frequency or tweeter driver 18 rather than the higher impedance path, through branch 22, which leads to the low frequency or woofer driver 24. An implementation for selection of the crossover frequency must be carefully evaluated and selected by weighing certain characteristics to avoid further difficulties or less than ideal matching of the crossover network to the drivers of the speaker system.

FIG. 1 depicts a first-order crossover network which has a characteristic rate of attenuation of 6 dB per octave. FIG. 2 depicts a second-order crossover network which has a characteristic rate of attenuation of 12 dB per octave. FIG. 3 depicts a third-order crossover network which has a characteristic rate of attenuation of 18 dB per octave. FIG. 4 depicts a fourth-order crossover network which has a characteristic rate of attenuation of 24 dB per octave. This demonstrates that to obtain higher rates of attenuation, the number of elements in the network increases in each parallel branch of the crossover network.

Higher order crossover networks are sharper filtering devices. For example, a first order crossover network attenuates at the rate of −6 dB per octave while a second order crossover network attenuates at the rate of −12 dB per octave. Therefore, if a sufficiently low crossover frequency was selected and a first order crossover network is employed, a substantial amount of lower frequencies will still be presented to the tweeter. What this means is that such an effect causes undesirable audible distortion, limits power handling, and can easily result in tweeter damage that could be avoided by using a higher order crossover network filter.

While FIGS. 1–4 have depicted crossover networks, such examples depict that crossover networks are generally implemented as a parallel set of individual filters. Furthermore, conventional crossover circuits have heretofore been implemented as parallel circuits such that the high frequency speaker or tweeter has presented thereto a signal having a first voltage phase while the low frequency or base circuit presents to a low frequency transducer or speaker a second voltage phase. Since these voltage phases are out of synchronization with each other, the resulting phase shifting in the high frequency circuit distorts due to the phase differential with the low frequency signal. That is to say, the individual voltage phases are completely out of synchronization with each other due to the capacitive shifting in the high frequency or tweeter circuit and the inductive shifting in the low frequency or woofer circuit. Such inherent loss of synchronization drastically distorts the original signal.

Thus, what is needed is a method and system for partitioning the electrical audio spectrum into a plurality of frequency bands that does not induce phase distortion between the respective transducers or speakers.

SUMMARY AND OBJECTS OF THE INVENTION

It is an object of the present invention to provide an apparatus for implementing a crossover network in a speaker system that performs frequency partitioning of the electrical audio signals into electrical bands without inducing phase delay between the signals reproduced by the respective transducers.

It is yet another object of the present invention to provide an apparatus for providing frequency partitioning in a manner that facilitates a more coherent transition between lower frequency bands and higher frequency bands without the introduction of phase delay and perceived distortion associated with phase discrepancies between specific bands of frequency presented to corresponding speakers.

The present invention provides a network such as a crossover network for use in an audio system. The network performs the function of partitioning and encouraging frequencies within a multiband audio signal as provided by an amplifier to be routed to a more conducive electro-acoustic transducer for reproducing the corresponding frequencies. In the preferred embodiment, the traditional crossover point of a traditional crossover network is replaced by a crossover region that see-saws the spectrum of an audio signal between at least two separate drivers or electro-acoustic transducers. Therefore, the traditional crossover point is replaced by a cooperative region wherein both electro-acoustic transducers cooperatively reproduce the sounds.

Traditional multi-way, more than one transducer, systems are plagued by phase distortion between the variously separated audio bands. Heretofore, any attempt to excite multiple electro-acoustic transducers have resulted in annoying distortion of the audio signal due to the interfering phase delays in the partitioned frequency bands. However, in the present invention, the various partitioning circuits retain the corresponding frequency bands in phase with the other bands as presented to each of the corresponding electro-acoustic transducers.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1A:
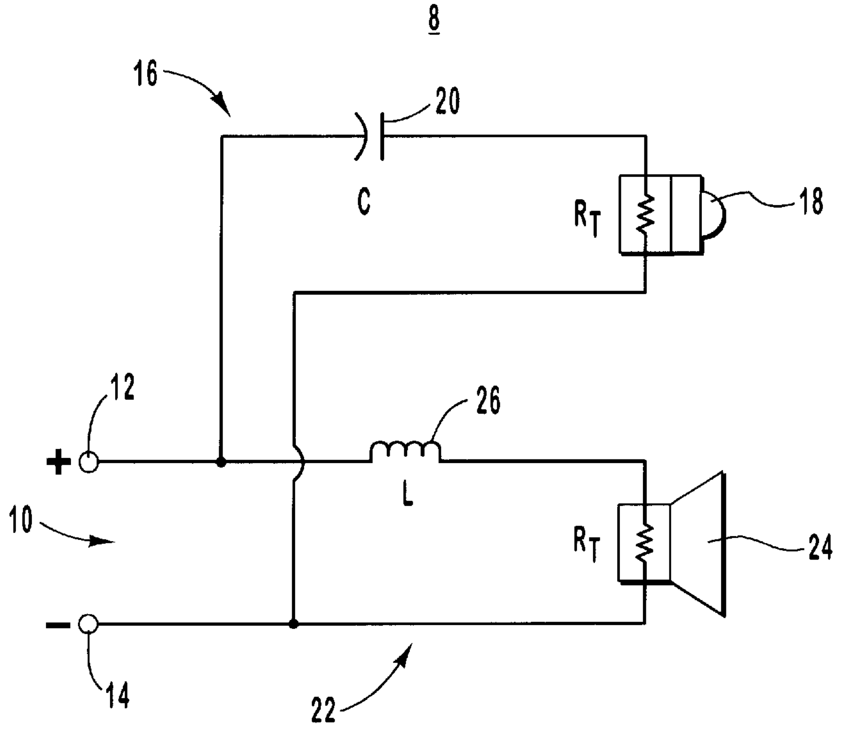
FIG. 1A (PRIOR ART)
FIGS. 1–4 are simplified diagrams of crossover networks employing at least one capacitor, in accordance with the prior art.
Figure 1B:
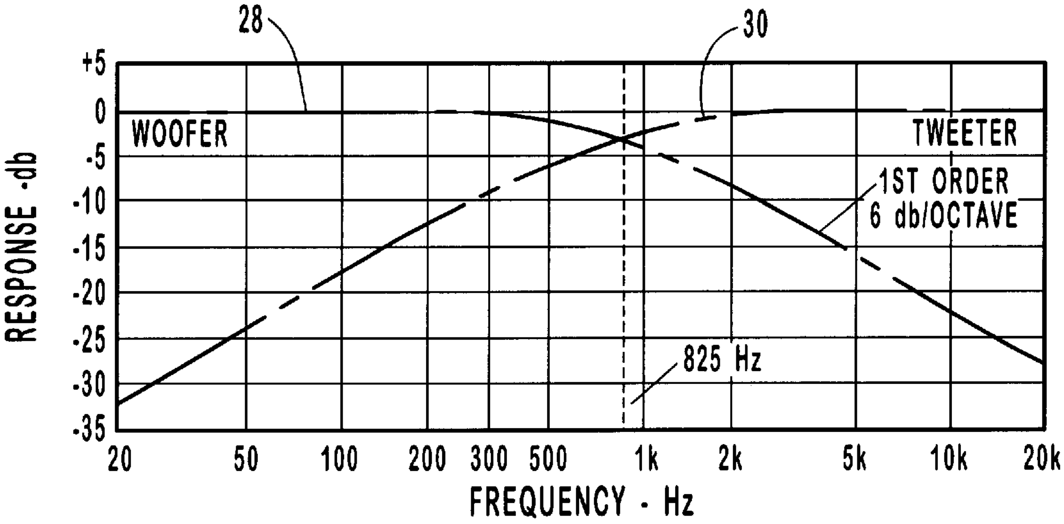
FIG. 1B (PRIOR ART)
Figure 2:
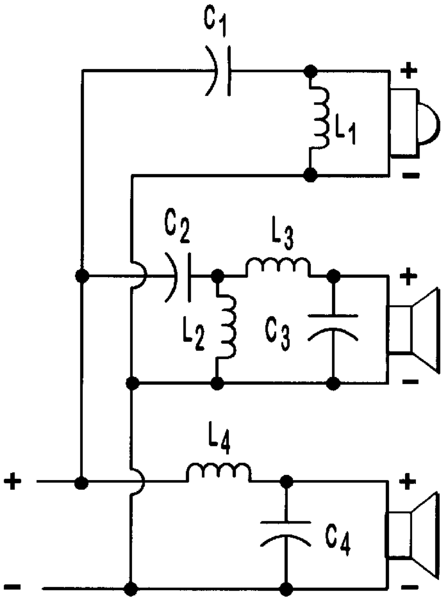
FIG. 2 (PRIOR ART)
Figure 3:
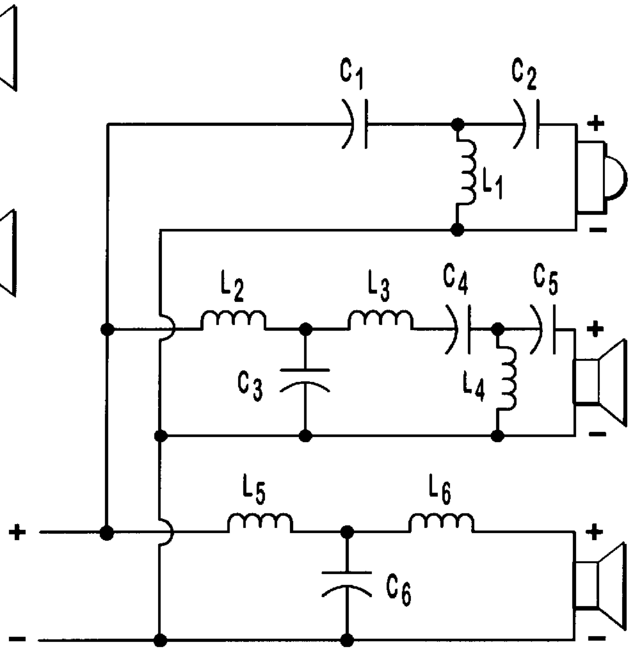
FIG. 3 (PRIOR ART)
Figure 4:
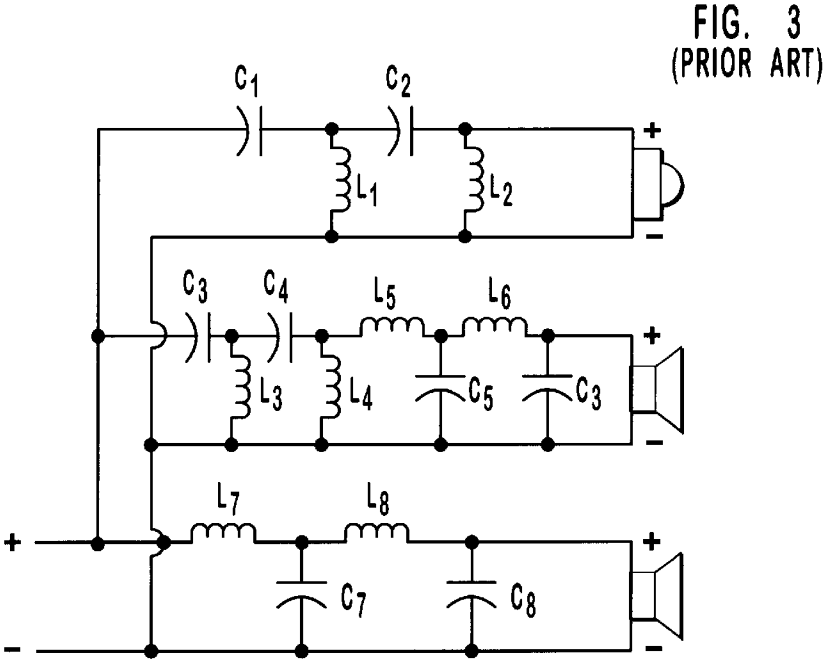
FIG. 4 (PRIOR ART)

As used herein, the term "amplifier" refers to any device or electronic circuit which has the capability to strengthen an electrical audio signal to sufficient power for use by an attached loudspeaker. These devices are frequently referred to as power amplifiers, or amps.

As used herein, the term "source device" refers to an apparatus for the generation of an electrical audio signal, such as a device which develops electrical audio frequency signals wholly within itself, for example a test signal generator. An apparatus for the generation of an electrical audio frequency signal from an originally acoustic action, for example a microphone. An apparatus for the generation of an electrical audio frequency signal from an originally mechanical action, for example an electric guitar, or electronic keyboard. An apparatus for the generation of an electric audio frequency signal from recorded or programmed media, for example a tape player, phonograph, compact disc player, or synthesizer. An apparatus for the generation of an electric audio frequency signal from a radio frequency (RF) broadcast, for example a tuner.

As used herein, the term "pre-amplifier" refers to an apparatus which is inserted electrically between source device(s) and amplifier(s) to perform control functions, and otherwise condition or process the electrical audio frequency signal before connecting it to the input of an amplifier. For example, selection between source devices, simultaneous blending or mixing of two or more source devices, volume, tone control, equalization, and/or balance. If such control is not desired and electrical signal from the source device is of compatible characteristic, then a source device may be connected directly to the input of an amplifier. One or more of the above functions may also sometimes be found incorporated within a source device or within an amplifier.

As used herein, the term "electro-acoustic transducer" refers to an apparatus for the conversion of an electrical audio frequency signal to an audible signal.

As used herein, the term "driver" refers to an electro-acoustic transducer most commonly connected to the output of an amplifier, either directly or via an electrically passive filter, also sometimes referred to as a "raw speaker".

As used herein, the term "speaker" refers to an apparatus consisting typically of a box-like enclosure with two or more drivers and an electrically passive filter installed therein, for the purpose of converting the electrical audio frequency signal of, for example, music or speech to the audible signal of such music or speech. Said drivers would be different in regard to the portion of the audible frequency spectrum which they were designed to accommodate.

As used herein, the term "electrically passive filter" refers to at least one electrical element, for example a capacitor, or inductor wired in-circuit between the output of an amplifier and the input of a driver, the purpose of which is to attenuate frequencies inappropriate to a specific driver, typically located within the box-like enclosure of the speaker.

As used herein, the term "crossover" refers to at least one electrically passive filter.

As used herein, the term "audio system" refers to any device or set of devices which contain a speaker, an amplifier, a pre-amplifier and a source device.

The present invention embodies within its scope an apparatus for partitioning an electrical audio spectrum as generated by an audio system amplifier into a plurality of frequency bands for powering the corresponding drivers in a speaker.

The frequency partitioning process of the present invention is accomplished through the use of a crossover network for partitioning the electrical audio spectrum. The purpose of the invention is to provide a means for retaining the voltage phase relationship between the drivers.

The present invention further provides a crossover network such that the high frequency and low frequency drivers are in a "parallel" circuit configuration in relation to each other. In such a parallel configuration, the high frequency and low frequency drivers will have the same "voltage" phase impressed a crossed them. Such a commonality of voltage maintains the high and low frequency drivers in "phase" with each other.

Figure 5:
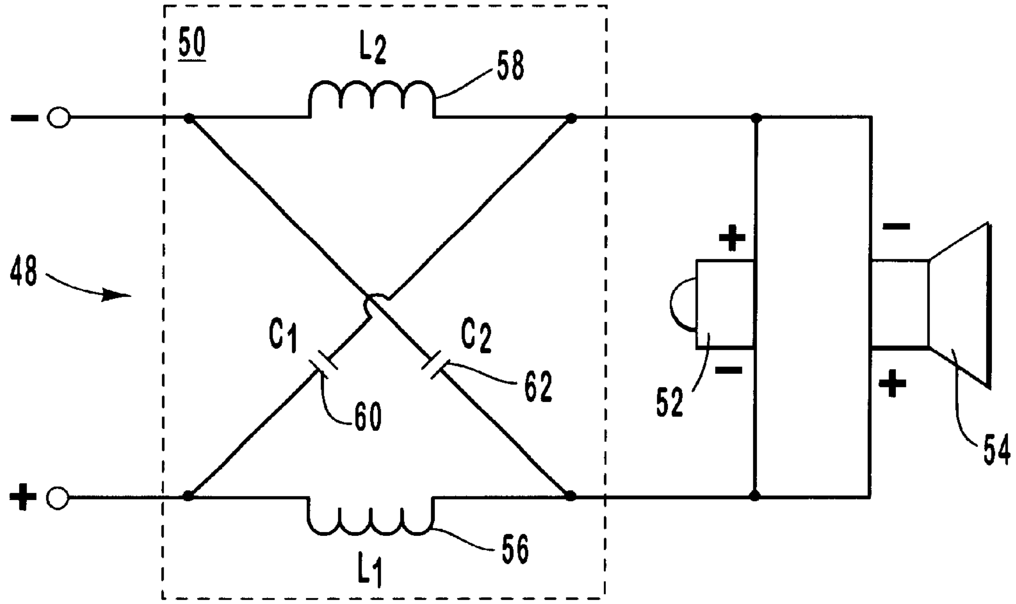
FIG. 5 depicts a simplified diagram of a two-way crossover network, in accordance with a preferred embodiment of the present invention.

FIG. 5 depicts a simplified schematic diagram of a crossover network in accordance with a preferred embodiment of the present invention. In a conventional crossover circuit, the high frequency driver traditionally each have their own circuit portion generating specific voltage phases for that branch of the crossover network. Such individual voltage phases are completely out of synchronization with each other due to the capacitive shifting in the high frequency driver circuit and due to the "inductive" phase shifting in the low frequency driver circuit portion. Such inherently out of synchronization phases drastically distort the original signal. The circuit as depicted in FIGS. 5–8 do not create an electrically induced "crossover" frequency or a frequency drop-out range. Rather, this circuit allows the high frequency and the low frequency drivers to respond to their naturally and individually unique frequency characteristics.

Furthermore traditional crossover circuits limit the signals presented to the high frequency and low frequency drivers. The voltages and currents that are impressed or forced upon the high frequency and low frequency drivers have been out of phase with each other, which drastically distorts the original signals. In the present invention, the crossover network assumes the form of an X circuit with the high frequency and low frequency drivers permitted to respond to their individual construction and electrical parameters. That is to say, there is no apparent "crossover point." In a traditional application, a high frequency driver's low end or the lower portion of the frequency response band is approximately 900 Hz and the low frequency driver's high end or high frequency response portion occurs at approximately 5 kHz providing a 4–5 kHz overlap. Such a frequency overlap is "in-phase" due to the same voltage being impressed across the high frequency and low frequency drivers simultaneously.

Referring to FIG. 5, a crossover network 50 is coupled to a high frequency driver or electro-acoustic transducer 52 which is also coupled in parallel with a low frequency driver or electro-acoustic transducer 54. Such parallel coupling enables both transducers to retain commonality and phase with the specific signals passing therethrough.

Crossover network 50 is further comprised of inputs 48 which present a multi-banded signal to crossover network 50. A positive input of inputs 48 is coupled serially to an inductor 56 which facilitates the passing or electrical conduction of low frequencies therethrough. Such lower frequencies find a path through at least low frequency driver or electro-acoustic transducer 54 and return back to the opposing input of input 48 via an inductor 58.

Similarly, input signals presented at inputs 48 having higher frequency components are accommodated via a pathway comprised of a capacitor 60 coupled to a positive input of inputs 48 which form a series path through a high frequency driver or electro-acoustic transducer 52 which is additionally coupled serially to a capacitor 62 terminating at a negative terminal of inputs 48.

In such a parallel configuration, the high frequency transducer is protected from lower frequency signals due to the low parallel DC resistance of the low frequency driver which accommodates the vast majority of the input signal's current. Additionally, the natural physical and electrical resonance of the high frequency transducer tends to ignore any frequencies that are below the lowest natural frequency range of the high frequency transducer. It should be pointed out that additional protection may be offered to the high frequency transducer by presenting additional protective capacitors or resistors in series therewith.

Component values for crossover network 50 are selected such that the inductance value of the two inductors is approximately equivalent to the inductance of the high frequency driver 52. A typical inductance value for a high frequency driver is on the order of about 450 micro-Henries. Additionally, the values of the two capacitors are preferably equated to a value whose impedance at 1 kHz equals approximately one half of the DC resistance of the high frequency driver. Typically, such a value is on the order of approximately 14 micro-Farad.

In such a configuration as that proposed in the present invention, both the high frequency driver and the low frequency driver by virtue of being basically tied together, perceive the same signal at the same time thereby presenting the same phase relationship of the input signal as presented at both of the transducers. Furthermore. each of the transducers tends to protect the other transducer from injurious signals by absorbing and responding to such signal presences. The transducers, rather than being activated more heavily at a crossover point, perform more in concert in a seesaw fashion thereby providing a very desirable continuous transition between the excitation of each electro-acoustic transducer. Furthermore, each of the respective transducers are traditionally endowed with inherent protection due to the natural cutoff natures of the these devices. For example, in the presence of low frequencies, the high frequency transducer has a natural cutoff region of approximately 1 kHz. When frequencies below 1 kHz are presented, the high frequency transducer appears primarily as a resistor to such signals. However, when such presented frequencies reach levels beyond 1 kHz, the high frequency transducer begins vibrating thereby producing augmentation of the lower frequencies. Similarly, the low frequency transducer is endowed with mechanical limitations of approximately 2.5 to 3 kHz. Some low frequency transducers exhibit a natural roll off of 2 kHz. Therefore, higher frequencies being passed through the low frequency transducer are inherently limited by the mechanical limitations and select the high frequency path through the high frequency transducer as the preferred path. however, when frequencies are present in a region that is physically serviceable by both transducers, both transducers, in voltage phase, undergo excitation and engage in the cooperative generation or reproduction of the input signal.

Figure 6:
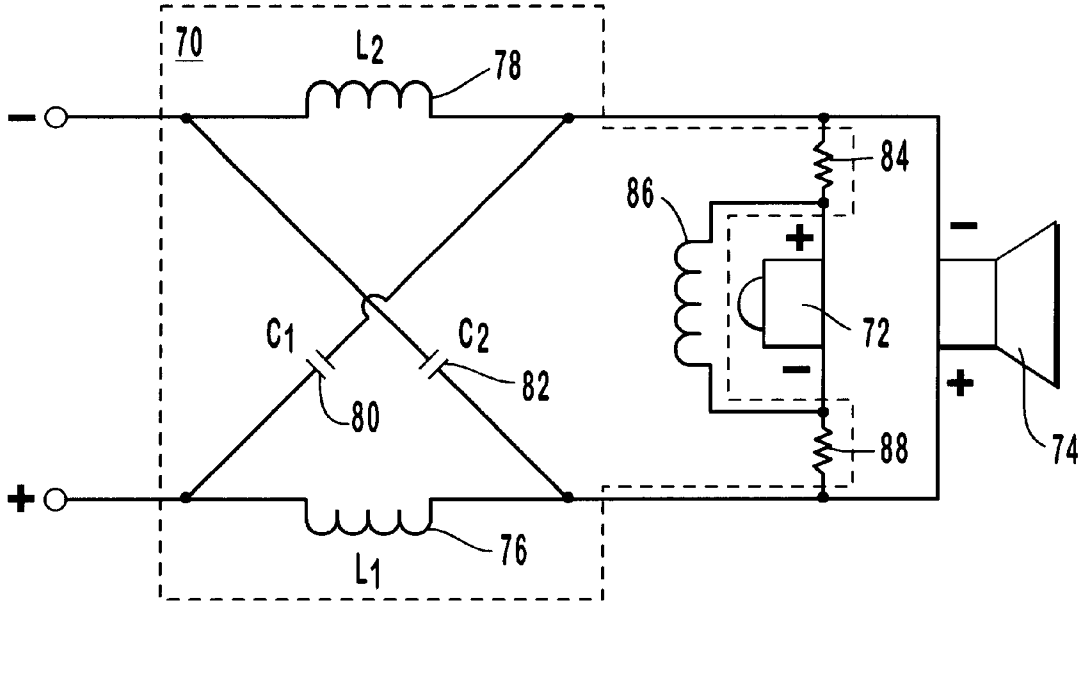
FIGS. 6–8 depict a simplified circuit diagram of two-way crossover networks having signal conditioning elements about the high frequency band transducer in accordance with other embodiments of the present invention.

FIG. 6 depicts a derivative of the crossover network depicted in FIG. 5. In FIG. 6, a crossover network 70 comprised of inductors 76 and 78 and capacitors 80 and 82 are coupled to high frequency driver or electro-acoustic transducer 72 and low frequency driver or electro-acoustic transducer 74 in a manner similar to FIG. 5. However, the embodiment as depicted in FIG. 6 is further comprised of resistors 84 and 88 which are in series with high frequency driver or electro-acoustic transducer 72 and an inductor 86 coupled in shunt with high frequency driver 72. Such configuration provides an attenuation through the high frequency driver path and has the effect of toning down the high frequency driver. Furthermore, the inclusion of an inductor 86 also provides an alternative low frequency path by passing the high frequency driver 72.

Figure 7:
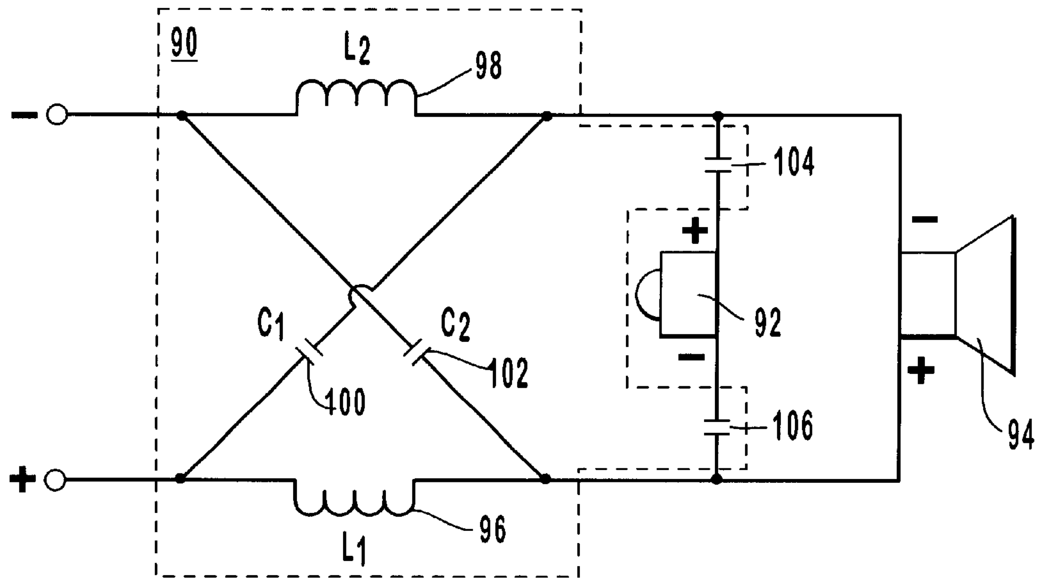

FIG. 7 depicts an alternate configuration of a crossover network, an in accordance with an alternate embodiment of the present invention. A crossover network 90 of FIG. 7, is comprised of conductors 96 and 98 and capacitors 100 and 102 similarly configured to the corresponding inductors and capacitors of the embodiment described in FIG. 5. Crossover network 90 of FIG. 7 is further comprised of series configured capacitors 104 and 106 coupled serially to high frequency driver or electro-acoustic transducer 92. Such a configuration provides additional impedance for low frequencies reaching the high frequency driver. Therefore, such energy is shunted to be absorbed more exclusively at the low frequency driver or electro-acoustic transducer 94. It should be pointed out that capacitors 104 and 106 may be selected to vary the frequency crossover point at which excitation begins in high frequency transducer 92.

Figure 8:
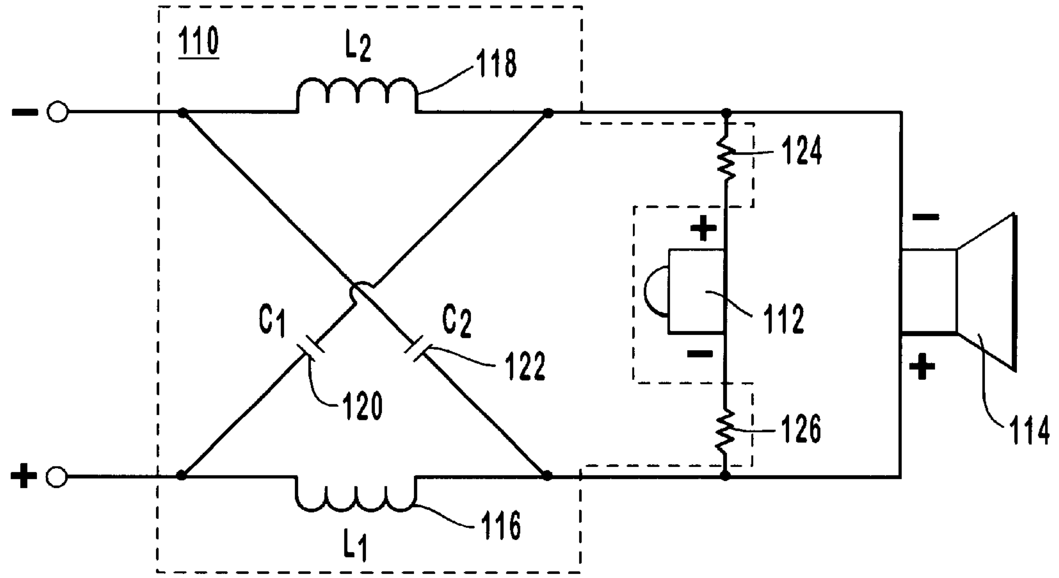

FIG. 8 depicts yet another embodiment of a crossover network. In FIG. 8, a crossover network 110 is comprised of inductors 116 and 118 as well as capacitors 120 and 122 which couple either directly or indirectly to high frequency driver or electro-acoustic transducer 112 and low frequency driver or electro-acoustic transducer 114. In the present embodiment, high frequency driver 112 is coupled in series with resistors 124 and 126. Resistors 124 and 126 by virtue of absorbing frequencies passing therebetween absorb a portion of the high frequency energy thereby toning the power exhibited by high frequency driver 112. Furthermore, the presence of resistors 124 and 126 increase the impedance through the high frequency path.

A crossover network for coupling the respective transducers in parallel thereby aligning the phase components of the various frequency bands has been presented. A system for enabling a multiband input signal to passively select a more conducive path has been presented. Furthermore, the present inventive aspects of the crossover network as presented in the preferred embodiment enable a multiband input signal to exhibit a very smooth and continuous transitionary profile between high and low frequencies as reproduced by the respective drivers or electro-acoustic transducers. Such an approach avoids phase differentials during the transition thereby unnecessarily inducing distortion into the reproduced input signal.

Those skilled in the art appreciate that additional components may augment the present disclosed embodiments. However, such additional components may be provided for the purposes of frequency shaping and non-linear gain functions. Such addition of wave shaping components and other nominal modifications are contemplated within the scope of the present invention.

The present invention may be embodied in other specific forms without departing from the spirit or essential characteristics. The described embodiments are to be considered in all respects as only illustrative and not restrictive. The scope of the invention is, therefore, indicated by the appended claims rather than the foregoing description. All changes which come within the meaning and range of equivalency of the claims are to be embraced within their scope.

What is claimed and desired to be secured by United States Letters Patent is:

1. In an audio system, a crossover network for partitioning by frequency the electrical audio signal as provided by at least one amplifier into a high frequency band and a low frequency band for powering a corresponding high frequency electro-acoustic transducer and low frequency electro-acoustic transducer, said crossover network comprising:

a. an input pair comprised of a positive input and a negative input as received from said at least one amplifier;

b. a first inductor having a first end electrically coupled to said positive input of said input pair and a second end for coupling to a first terminal of said low frequency transducer;

c. a second inductor having a first end for coupling to a second terminal of said low frequency transducer and a second end electrically coupled to said negative input of said input pair;

d. a first capacitor having a first end electrically coupled to said positive input of said input pair and a second end electrically coupled to said first end of said second inductor, said second end also for electrically coupling at least indirectly to a first end of said high frequency transducer; and e. a second capacitor having a first end electrically coupled to said second end of said first inductor, said first end also for electrically coupling at least indirectly to a second end of said high frequency transducer, said second capacitor also having a second end electrically coupled to said negative input of said input pair, said low frequency transducer coupled at least partially in parallel with said high frequency transducer.

2. In an audio system, the crossover network, as recited in claim 1, further comprising:

a) a first resistor electrically coupled by a first end to said second end of said first capacitor and said first end of said second inductor, said first resistor also having a second end for electrically coupling directly with said first end of said high frequency transducer.

3. In an audio system, the crossover network, as recited in claim 2, further comprising:

a) a second resistor electrically coupled by a first end to said first end of said second capacitor and said second end of said first inductor, said second resistor also having a second end for electrically coupling directly with said second end of said high frequency transducer.

4. In an audio system, a crossover network for partitioning by frequency the electrical audio signal as provided by at least one amplifier into a high frequency band and a low frequency band for powering a corresponding high frequency electro-acoustic transducer and low frequency electro-acoustic transducer, said crossover network comprising:

a. an input pair comprised of a positive input and a negative input as received from said at least one amplifier;

b. a first inductor having a first end electrically coupled to said positive input of said input pair and a second end for coupling to a first terminal of said low frequency transducer;

c. a second inductor having a first end for coupling to a second terminal of said low frequency transducer and a second end electrically coupled to said negative input of said input pair;

d. a first capacitor having a first end electrically coupled to said positive input of said input pair and a second end electrically coupled to said first end of said second inductor, said second end also for electrically coupling at least indirectly to a first end of said high frequency transducer;

e. a second capacitor having a first end electrically coupled to said second end of said first inductor, said first end also for electrically coupling at least indirectly to a second end of said high frequency transducer, said second capacitor also having a second end electrically coupled to said negative input of said input pair; and f. a third inductor for electrically coupling in shunt with said high frequency transducer, said third inductor having a first end electrically coupled to said second end of said second resistor and a second end electrically coupled to said second end of said first resistor.

5. In an audio system, a crossover network for partitioning by frequency the electrical audio signal as provided by at least one amplifier into a high frequency band and a low frequency band for powering a corresponding high frequency electro-acoustic transducer and low frequency electro-acoustic transducer, said crossover network comprising:

a. an input pair comprised of a positive input and a negative input as received from said at least one amplifier;

b. a first inductor having a first end electrically coupled to said positive input of said input pair and a second end for coupling to a first terminal of said low frequency transducer;

c. a second inductor having a first end for coupling to a second terminal of said low frequency transducer and a second end electrically coupled to said negative input of said input pair;

d. a first capacitor having a first end electrically coupled to said positive input of said input pair and a second end electrically coupled to said first end of said second inductor, said second end also for electrically coupling at least indirectly to a first end of said high frequency transducer;

e. a second capacitor having a first end electrically coupled to said second end of said first inductor, said first end also for electrically coupling at least indirectly to a second end of said high frequency transducer, said second capacitor also having a second end electrically coupled to said negative input of said input pair; and f. a third capacitor electrically coupled by a first end to said second end of said first capaicitor and said first end of said second inductor, said third capacitor also having a second end for electrically coupling directly with said first end of said high frequency transducer.

6. In an audio system, the crossover network, as recited in claim 5, further comprising:

a) a fourth capacitor electrically coupled by a first end to said first end of said second capaicitor and said second end of said first inductor, said fourth capacitor also having a second end for electrically coupling directly with said second end of said high frequency transducer.

7. In an audio system, a speaker having a crossover network for partitioning by frequency the electrical audio signal as provided by at least one amplifier into a high frequency band and a low frequency band, said speaker comprising:

a. a high frequency transducer through which said high frequency band of said electrical audio signals are acoustically reproduced;

b. a low frequency transducer through which said low frequency band of said electrical audio signals are acoustically reproduced, said low frequency transducer coupled at least partially in parallel with said high frequency transducer; and c. said crossover network comprising:

i. an input pair comprised of a positive input and a negative input as received from said at least one amplifier;

ii. a first inductor having a first end electrically coupled to said positive input of said input pair and a second end for coupling to a first terminal of said low frequency transducer;

iii. a second inductor having a first end for coupling to a second terminal of said low fiequency transducer and a second end electrically coupled to said negative input of said input pair;

iv. a first capacitor having a first end electrically coupled to said positive input of said input pair and a second end electrically coupled to said first end of said second inductor, said second end also for electrically coupling at least indirectly to a first end of said high frequency transducer; and v. a second capacitor having a first end electrically coupled to said second end of said first inductor, said first end also for electrically coupling at least indirectly to a second end of said high frequency transducer, said second capacitor also having a second end electrically coupled to said negative input of said input pair.

8. In an audio system, the speaker as recited in claim 7, wherein said crossover network further comprises:

a) a first resistor electrically coupled by a first end to said second end of said first capaicitor and said first end of said second inductor, said first resistor also having a second end for electrically coupling directly with said first end of said high frequency transducer.

9. In an audio system, the speaker as recited in claim 8, wherein said crossover network further comprises:

a) a second resistor electrically coupled by a first end to said first end of said second capaicitor and said second end of said first inductor, said second resistor also having a second end for electrically coupling directly with said second end of said high frequency transducer.

10. In an audio system, a speaker having a crossover network for partitioning by frequency the electrical audio signal as provided by at least one amplifier into a high frequency band and a low frequency band, said speaker comprising:

a. a high frequency transducer through which said high frequency band of said electrical audio signals are acoustically reproduced;

b. a low frequency transducer throughwhich said low fiequency band of said electrical audio signals are acoustically reproduced; and c. said crossover network comprising:

i. an input pair comprised of a positive input and a negative input as received from said at least one amplifier;

ii. a first inductor having a first end electrically coupled to said positive input of said input pair and a second end for coupling to a first terminal of said low frequency transducer;

iii. a second inductor having a first end for coupling to a second terminal of said low frequency transducer and a second end electrically coupled to said negative input of said input pair;

iv. a first capacitor having a first end electrically coupled to said positive input of said input pair and a second end electrically coupled to said first end of said second inductor, said second end also for electrically coupling at least indirectly to a first end of said high frequency transducer;

v. a second capacitor having a first end electrically coupled to said second end of said first inductor, said first end also for electrically coupling at least indirectly to a second end of said high frequency transducer, said second capacitor also having a second end electrically coupled to said negative input of said input pair; and d. a third inductor for electrically coupling in shunt with said high frequency transducer, said third inductor having a first end electrically coupled to said second end of said second resistor and a second end electrically coupled to said second end of said first resistor.

11. In an audio system, a speaker having a crossover network for partitioning by frequency the electrical audio signal as provided by at least one amplifier into a high frequency band and a low frequency band, said speaker comprising:

a. a high frequency transducer through which said high frequency band of said electrical audio signals are acoustically reproduced;

b. a low frequency transducer throughwhich said low frequency band of said electrical audio signals are acoustically reproduced; and c. said crossover network comprising:

i. an input pair comprised of a positive input and a negative input as received from said at least one amplifier;

ii. a first inductor having a first end electrically coupled to said positive input of said input pair and a second end for coupling to a first terminal of said low frequency transducer;

iii. a second inductor having a first end for coupling to a second terminal of said low frequency transducer and a second end electrically coupled to said negative input of said input pair;

iv. a first capacitor having a first end electrically coupled to said positive input of said input pair and a second end electrically coupled to said first end of said second inductor, said second end also for electrically coupling at least indirectly to a first end of said high frequency transducer;

v. a second capacitor having a first end electrically coupled to said second end of said first inductor, said first end also for electrically coupling at least indirectly to a second end of said high frequency transducer, said second capacitor also having a second end electrically coupled to said negative input of said input pair; and d. a third capacitor electrically coupled by a first end to said second end of said first capaicitor and said first end of said second inductor, said third capacitor also having a second end for electrically coupling directly with said first end of said high frequency transducer.

12. In an audio system, the speaker as recited in claim 11, wherein said crossover network further comprises:

a) a fourth capacitor electrically coupled by a first end to said first end of said second capacitor and said second end of said first inductor, said fourth capacitor also having a second end for electrically coupling directly with said second end of said high frequency transducer.

13. An audio network for coupling an input pair having a positive input and a negative input for conducting a multi-frequency audio signal for reproduction by a high frequency electro-acoustic transducer and a low frequency electro-acoustic transducer, said audio network comprising:

a. a first inductor having a first end for electrically coupling to said positive input of said input pair and a second end for coupling to a first terminal of said low frequency transducer;

b. a second inductor having a first end for coupling to a second terminal of said low frequency transducer and a second end for electrically coupling to said negative input of said input pair;

c. a first capacitor having a first end for electrically coupling to said positive input of said input pair and a second end electrically coupled to said first end of said second inductor, said second end also for electrically coupling at least indirectly to a first end of said high frequency transducer; and d. a second capacitor having a first end electrically coupled to said second end of said first inductor, said first end also for electrically coupling at least indirectly to a second end of said high frequency transducer, said second capacitor also having a second end for electrically coupling to said negative input of said input pair, said low frequency transducer coupled at least partially in parallel with said high frequency transducer.

14. The audio network, as recited in claim 13, further comprising:

a) a first resistor electrically coupled by a first end to said second end of said first capacitor and said first end of said second inductor, said first resistor also having a second end for electrically coupling directly with said first end of said high frequency transducer.

15. The audio network, as recited in claim 14, further comprising:

a) a second resistor electrically coupled by a first end to said first end of said second capacitor and said second end of said first inductor, said second resistor also having a second end for electrically coupling directly with said second end of said high frequency transducer.

16. An audio network for coupling an input pair having a positive input and a negative input for conducting a multi-frequency audio signal for reproduction by a high frequency electro-acoustic transducer and a low frequency electro-acoustic transducer, said audio network comprising:

a. a first inductor having a first end for electrically coupling to said positive input of said input pair and a second end for coupling to a first terminal of said low frequency transducer;

b. a second inductor having a first end for coupling to a second terminal of said low frequency transducer and a second end for electrically coupling to said negative input of said input pair;

c. a first capacitor having a first end for electrically coupling to said positive input of said input pair and a second end electrically coupled to said first end of said second inductor, said second end also for electrically coupling at least indirectly to a first end of said high frequency transducer;

d. a second capacitor having a first end electrically coupled to said second end of said first inductor, said first end also for electrically coupling at least indirectly to a second end of said high frequency transducer, said second capacitor also having a second end for electrically coupling to said negative input of said input pair; and e. a third inductor for electrically coupling in shunt with said high frequency transducer, said third inductor having a first end electrically coupled to said second end of said second resistor and a second end electrically coupled to said second end of said first resistor.

17. An audio network for coupling an input pair having a positive input and a negative input for conducting a multi-frequency audio signal for reproduction by a high frequency electro-acoustic transducer and a low frequency electro-acoustic transducer, said audio network comprising:

a. a first inductor having a first end for electrically coupling to said positive input of said input pair and a second end for coupling to a first terminal of said low frequency transducer;

b. a second inductor having a first end for coupling to a second terminal of said low frequency transducer and a second end for electrically coupling to said negative input of said input pair;

c. a first capacitor having a first end for electrically coupling to said positive input of said input pair and a second end electrically coupled to said first end of said second inductor, said second end also for electrically coupling at least indirectly to a first end of said high frequency transducer;

d. a second capacitor having a first end electrically coupled to said second end of said first inductor, said first end also for electrically coupling at least indirectly to a second end of said high frequency transducer, said second capacitor also having a second end for electrically coupling to said negative input of said input pair; and e. a third capacitor electrically coupled by a first end to said second end of said first capacitor and said first end of said second inductor, said third capacitor also having a second end for electrically coupling directly with said first end of said high frequency transducer.

18. The audio network. as recited in claim 17, further comprising:

a) a fourth capacitor electrically coupled by a first end to said first end of said second capacitor and said second end of said first inductor said fourth capacitor also having a second end for electrically coupling directly with said second end of said high frequency transducer.

* * * * *

UNITED STATES PATENT AND TRADEMARK OFFICE

CERTIFICATE OF CORRECTION

PATENT NO. : 6,310,959 B1
DATED : October 30, 2001
INVENTOR(S) : Eric Alexander

It is certified that error appears in the above-identified patent and that said Letters Patent is hereby corrected as shown below:

Title page,
ABSTRACT, line 1, after "frequency" change "and" to -- an --

Column 1,
Line 34, change "drivers." to -- drivers, --

Column 5,
Line 31, change "a crossed" to -- across --
Line 37, after "frequency" change "driver" to -- drivers --

Column 6,
Line 12, after "least" insert -- the --

Column 7,
Line 6, change "however" to -- However --
Line 27, after "network," change "an" to -- and --

Column 11,
Line 4, change "throughwhich" to -- through which --
Line 5, change "fienquency" to -- frequency --

Signed and Sealed this

Seventh Day of May, 2002

Attest:

JAMES E. ROGAN

*Attesting Officer* *Director of the United States Patent and Trademark Office*